United States Patent [19]
Hashimoto et al.

[11] Patent Number: 5,476,753
[45] Date of Patent: Dec. 19, 1995

[54] FINE PATTERN FORMING METHOD

[75] Inventors: Kazuhiko Hashimoto, Moriguchi; Masayuki Endo, Izumi, both of Japan

[73] Assignee: Matsushita Electric Industrial Co., Ltd., Osaka, Japan

[21] Appl. No.: 238,793

[22] Filed: May 6, 1994

Related U.S. Application Data

[63] Continuation-in-part of Ser. No. 916,748, Jul. 22, 1992, abandoned.

[30] Foreign Application Priority Data

Jul. 22, 1991 [JP] Japan ..................... 3-180836

[51] Int. Cl.$^6$ ..................... G03C 5/00
[52] U.S. Cl. ............ 430/296; 430/270; 430/313; 430/317; 430/323; 430/326; 430/330; 430/942
[58] Field of Search ..................... 430/296, 942, 430/326, 270, 323, 313, 317, 330, 329

[56] References Cited

U.S. PATENT DOCUMENTS

| | | | |
|---|---|---|---|
| 4,689,289 | 8/1987 | Crivello | 430/326 |
| 4,810,617 | 3/1989 | White et al. | 430/296 |
| 5,338,818 | 8/1994 | Brunsvold et al. | 430/270 |
| 5,372,908 | 12/1994 | Hayase et al. | 430/192 |

FOREIGN PATENT DOCUMENTS

| | | | |
|---|---|---|---|
| 2-248952 | 10/1990 | Japan | 430/270 |
| 4-50947 | 2/1992 | Japan | 430/296 |

OTHER PUBLICATIONS

Patent & Trademark Office English Translation of Japanese Patent 4–50947 (Pub. Date Feb. 19, 1992).
Patent & Trademark Office English Translation of Japanese Patent 2–248952 (Pub Date Oct. 4, 1990).
"Chemistry and Technology of Silicones" by Walter Noll 1968, pp. 1—3, 9–16.
"Grant & Hackh's Chemical Dictionary", 5th Edition 1987 p. 290.
The Role of the Latent Image in a New Dual Image, Aqueous Developable, Thermally Stable Photoresist. Wayne E. Feely et al., Polymer Engineering and Science, Mid–Summer, 1986, vol. 26, No. 16 pp. 1101–1104.

*Primary Examiner*—Janis L. Dote
*Attorney, Agent, or Firm*—Wenderoth, Lind & Ponack

[57] ABSTRACT

A high polymer organic film is applied as a bottom layer to a semiconductor silicon substrate. Then, a material including an acid generator and a polysilane resin insoluble in an alkaline solution is applied to the bottom layer as an electron beam resist layer. The polysilane resin includes a Si—Si bond or Si—O bond in a principle chain and a substituted hydroxy group expressed as —OR in a side chain wherein R denotes a substitution group of hydrocarbon. The acid generator generates an acid when irradiated with an electron beam. Then, a pattern is formed with an electron beam in the photosensitive layer, and it is developed with an alkaline solution. Then, by using the resist pattern as a mask, the bottom layer is etched. Thus, a fine resist pattern of correct high aspect ratio can be formed easily.

3 Claims, 5 Drawing Sheets

PRIOR ART

FINE PATTERN FORMING METHOD

This application is a continuation-in-part of now abandoned application Ser. No. 07/916,748, filed Jul. 22, 1992, now abandoned.

BACKGROUND OF THE INVENTION

1. Field of the Invention

The present invention relates to a method of forming a fine pattern with an electron beam lithography technique to produce a semiconductor device or an integrated circuit.

2. Description of the Prior Art

In the manufacturing process of an integrated circuit or the like, patterning is performed in the photolithography technique with use of an ultraviolet ray. As the size of an element has been demanded to be smaller, the numerical aperture of stepper lens has been increased and a light source of shorter wavelength has been used. However, this makes the focus depth shallow. On the other hand, as the pattern size of an LSI element has become finer and an ASIC has been manufactured, an electron beam lithography has been developed.

An electron beam resist is indispensable for the formation of fine pattern with the electron beam lithography technique. Among the electron beam resists, polymethylmethacrylate (PMMA) is known to have the highest resolution, but its low sensitivity is a problem. Then, recently a lot of workers developed many resists to enhance the sensitivity of a positive type electron beam resist: polybutyl methacrylate, a copolymer of methyl methacrylate and methacrylic acid, a copolymer of methacrylic acid and acrylonitrile, a copolymer of methylmethacrylate and isobutylene, polybutene-1-sulfone, polyisopropenyl ketone, and fluoropolymethacrylate. These resists all have an electron withdrawing group in a side chain or introduce in a principle chain a bond which can be decomposed easily with an electron beam and to enhance the sensitivity. However, they do not satisfy both resolution and sensitivity. Further, the dry etch resistance and the heat resistance are not good enough. Therefore, they are hardly used for a mask for dry etch, and its use is limited.

On the other hand, when a positive type resist having a one-component polymer based on PMMA is developed, an organic solvent is necessary, and when the development is performed, the resist film may swell in the developer with an organic solvent. Then, the resolution of the pattern becomes lower, and the pattern may be distorted in some cases and cannot be used practically. Further, a developer with an organic solvent is harmful on environment and health, and it is also not appropriate as to the flammability.

Recently, enhancing the sensitivity of a positive type electron beam resist has been tried by introducing the concept of chemical amplification. The resist is a three-component substance including a photo acid generator which can generate an acid when irradiated with an electron beam, a polymer which reacts with acid, and a novolac resin as a matrix polymer.

The photo acid generator is for example an organic halide compound or an onium salt. The organic halide compound may be 1,1-bis[p-chlorophenyl]-2,2,2-trichloroethane, 1,1-bis[p-methoxyphenyl]-2,2,2-trichloroethane, 1,1-bis[p-chlorophenyl]-2,2-dichloroethane or 2-chloro-6-(trichloromethyl) pyridine. The onium salt may be a triphenyl sulfonium salt or a diphenyl iodonium salt. These compounds generate a Lewis acid as a strong acid when irradiated with an electron beam.

Some examples of the polymers which react with the acid have the following chemical formulas:

and

These polymers react with the generated acid according to the following decomposition reaction:

The matrix polymer conducts the following decomposition reaction (hydrolysis reaction ) with an acid generated:

In order to proceed the decomposition (hydrolysis) reaction, a heat treatment is needed just after the drawing of a pattern with the electron beam. Then, the reaction or the decomposition of the side chain proceeds. That is, a Lewis acid is generated when a pattern is drawn with an electron beam in the polymer insoluble in the alkaline solution, and the acid makes the polymer soluble in the alkaline solution. Thus, a positive type pattern can be formed.

Further, in the electron beam lithography, there are problems such as dry etch resistance of electron beam resist, the poor heat resistance, the effect of proximity effect due to the forward and back scatterings of electrons on the precision of pattern. In order to counteract these problems, a multi layer resist which divides the functions of the resist into an imaging layer and a planarizing layer is very favorable.

FIGS. 1(a)–(d) illustrate a prior art three-layer resist process of electron beam lithography. In order to suppress the proximity effect, a high polymer organic film as a bottom layer 51 by 2–3 μm thickness is applied to a substrate 55, and the heat treatment is performed (FIG. 1(a)). Further, an inorganic film of $SiO_2$ or the like or an inorganic high polymer film of spin-on-glass (SOG) or the like of 0.2 μm as an intermediate film 52 is applied to the bottom layer 51, and an electron beam resist such as PMMA of 0.5 μm thickness as a top layer resist 53 is applied to the intermediate layer 52 (FIG. 1(b)). Then, a pattern is drawn with an electron beam 54 on the resist film 53, and a resist pattern 53P is obtained by developing of a developer of an inorganic solvent (FIG. 1(c)). Next, the dry etching of the intermediate layer 52 is performed with use of the resist pattern 53P as a mask, and the dry etching of the bottom layer 51 is performed with use of the intermediate layer 52 as a mask. Thus, the pattern is transferred (FIG. 1(d)).

A fine pattern of a high aspect ratio can be formed by using a multi-layer resist process. However, the three-layer resist process needs complicated steps and generates many defects. If the selectivity against the etching of the intermediate and bottom layers is small, the pattern size shift on the pattern transfer increases by 0.1 μm or more. Therefore, the three layer resist is difficult to be used practically.

In the electron beam lithography process, incident electrons are scattered inside the resist, and the electrons which reach the substrate are scattered backward and returned again to sensitize the resist. Because the precision of the pattern worsens largely due to such proximity effect, the bottom layer is required to be applied thickly in order to suppress the backward scattering electrons.

Then, silicone-containing resists and inorganic resists for a bi-layer resist process having two functions as a mask of the bottom film and the resist layer have been developed. For example, a substance including a siloxane bond in the principle chain, a ladder type polysiloxane and a chalcogenide glass type inorganic resist. However, they cannot yet improve the dry etch resistance sufficiently, and the sensitivity and the resolution are too poor to be used practically. In concrete terms, the sensitivity of prior art main resists are about 20 $\mu C/cm^2$ and the resolution is about 1 μm. Further, because these resists use an organic solvent as a developer, the changes in size and in sensitivity are large, the process latitude is small, and swelling occurs on developing which makes it difficult to form the pattern correctly. Further, the environment pollution and the harms to the human body are also problems.

SUMMARY OF THE INVENTION

An object of the present invention is to provide a method for forming a fine pattern on a resist with an electron beam.

In the present invention, a photosensitive solution is used for electron beam resist, and it comprises a polysilane or polysilicon resin as a main polymer insoluble in an alkaline solution and an acid generator which generates an acid when irradiated with an electron beam. The polysilane resin includes a Si—Si bond in a principal chain and an acid sensitive group expressed as —OR in a side chain wherein R denotes a group which can be decomposed by an acid generated by the acid generator, so that the —OR group is decomposed to a hydroxy group —OH by the acid. Similarly, the polysilicone resin includes a Si—O bond in a principal chain and an acid sensitive group expressed as —OR in a side chain, wherein R denotes a group which can be decomposed by an acid generated by the acid generator, so that the —OR group is decomposed to a hydroxy group by the acid. In the process of forming a fine pattern, a polymer organic film such as novolac resin is formed on a semiconductor substrate. Then, the photosensitive solution is applied to the high polymer organic film, and a photosensitive layer is formed by baking the photosensitive solution. Next, a positive type resist pattern is formed with an electron beam in the photosensitive layer, and the photosensitive layer is heated to accelerate the decomposition reaction of the generated acid with the acid labile —OR group in the side chain to make the polysilane or polysilicone resin in the pattern region to be soluble in an alkaline solution. Because the resist includes the acid generator, the decomposition reaction of the side chain with the generated acid proceeds at a small dosage, and the polysilane or polysilicone resin having a hydroxy group generated at the side chain becomes soluble in an alkaline aqueous solution. Then, an alkaline aqueous solution can be used to develop the photosensitive layer without causing swelling, and the high polymer organic film is etched to form a pattern. The polysilane or polysilicone resin is preferably a ladder type polysilane or polysilicone to produce a resist pattern of high dry etch resistance. Then, the size shift can be reduced. As mentioned above, two layer resist process is used, so that the resist process can be simplified. A polysilicone resin including a Si—O bond in a principal chain and an acid sensitive group expressed as —OR in a side chain can also be used similarly in the two layer resist process.

An advantage of the present invention is that a positive type fine resist pattern can be formed precisely at a high sensitivity and at a high resolution.

BRIEF DESCRIPTION OF THE DRAWINGS

These and other objects and features of the present invention will become clear from the following description taken in conjunction with the preferred embodiments thereof with reference to the accompanying drawings, and in which.

DETAILED DESCRIPTION OF THE PREFERRED EMBODIMENTS

The present invention solves the above-mentioned problems by using a multi-component substance as a positive type electron beam resist. The multi-component substance comprises a polysilicone or polysilicone resin insoluble in an alkaline aqueous solution and an acid generator which generates an acid when irradiated with an electron beam.

The polysilicone resin as a main polymer has a Si—O bond in the principal chain and an acid sensitive group expressed as —OR in a side chain wherein R denotes a group which can be decomposed by an acid generated by the acid generator, so that the —OR group is decomposed to a hydroxy group —OH by the acid. R may be, for example, an ester, carbonate or substituted hydrocarbon group. A polysilane resin having Si—Si bond, instead of a Si—Si bond, instead of a Si—O bond, in a principal chain and an acid sensitive group —OR in a side chain can also be used as a main polymer. The substituted hydroxy group expressed as —OR in a side chain of the polysilicone or polysilane resin has a and

The photo acid generator is for example an organic halide compound or an onium salt. The organic halide compound may be 1,1-bis[p-chlorophenyl]-2,2,2-trichloroethane, 1,1-bis[p-methoxyphenyl] -2,2,2-trichloroethane, 1,1-bis[p-chlorophenyl]-2,2-dichloroethane or 2-chloro-6-(trichloromethyl) pyridine. Further, the onium salt may be a triphenyl sulfonium salt or a diphenyl iodonium salt having the following structures:

and

These compounds generate a Lewis acid as a strong acid when irradiated with an electron beam. Then, the polysilane or polysilicone resin as a main polymer reacts with the generated acid. As the reaction proceeds, a hydroxy group is formed from the acid labile —OR side chain of the polysilane or polysilicone resin, and the substance is changed to a alkaline soluble polymer. That is, by drawing a pattern with an electron beam in the resist, an acid is generated from the acid generator, and it reacts with the acid labile side chain to make the polysilane or polysilicone resin soluble in an alkaline solution. The polysilane or polysilicone resin is orginally insoluble resin extending in a region not drawn with an electron beam is not dissolved by an alkaline solution, while the region drawn with the electron beam is dissolved by the alkaline solution because hydroxy groups are formed. Thus a positive type fine resist pattern can be formed easily and correctly.

By using the silane-containing or silicone-containing substance as a top layer of the two layer resist, the following advantages can be realized. That is, a multi-layer resist can be formed easily and the number of the steps of lithography can be decreased. The dry etch resistance is sufficiently high. The size shift due to the etching of pattern transfer does not occur. The sensitivity is sufficiently high. Because an organic alkaline aqueous solution can be used as a developer, the swelling on the development can be prevented, and there are no problems in respect to the environment and the human body.

Referring now to the drawings, embodiments of the present invention will be explained below.

Embodiment 1

Figure 1A:
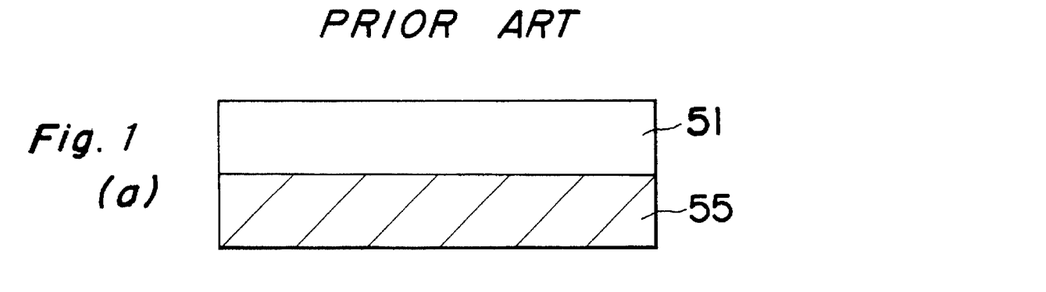
FIGS. 1(a)–(d) are schematic sectional views of a prior art method of forming a fine pattern with a three-layer resist process.
Figure 1B:
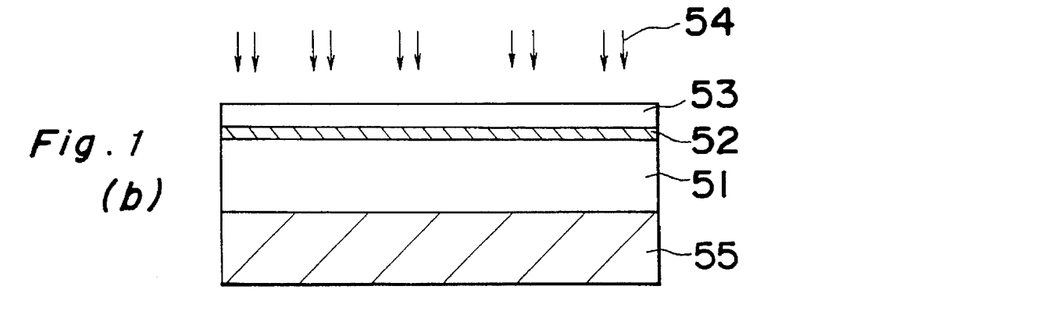
Figure 1C:
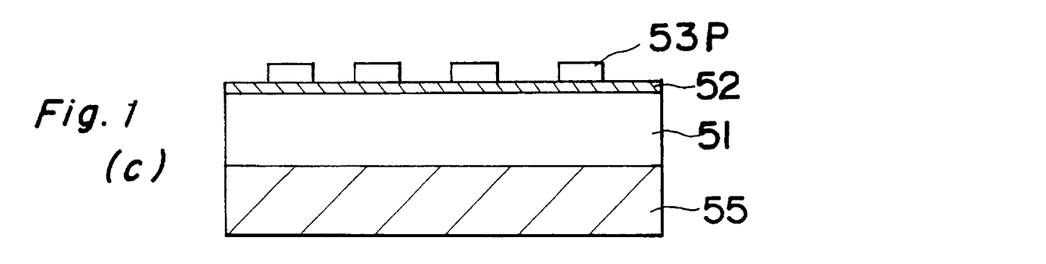
Figure 1D:
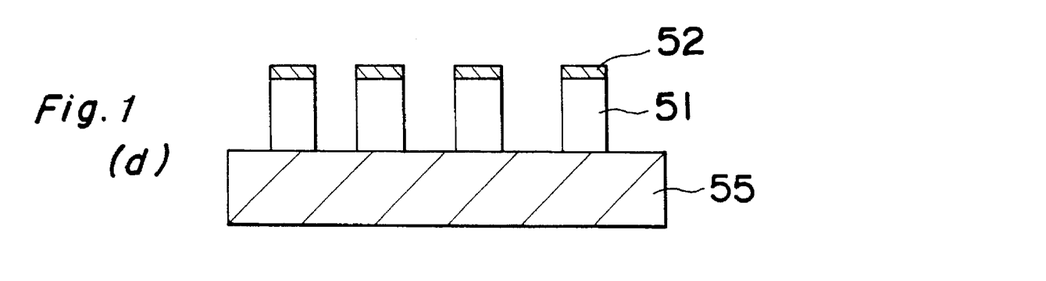
Figure 2:
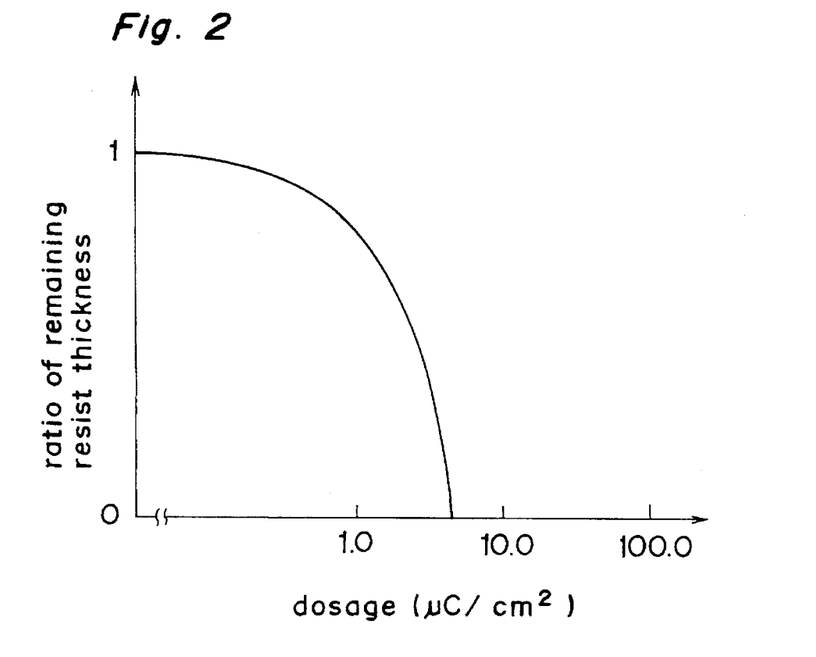
FIG. 2 is a graph of the sensitivity curve of the remaining resist thickness against the dosage in Embodiment 1.

An acid generator of 1.0 g of 1,1-bis[p-chlorophenyl] -2,2,2-trichloroethane and a ladder type poly(p-hydroxyphenylsilane) substituted by a t-butoxycarbonyl group are dissolved in an ethyl cellosolve acetate solution to form a mixture. The mixture is stirred slowly at 25° C. for sixty minutes, and the insoluble substances are filtered to get a homogeneous solution. The solution is dropped on a semiconductor silicon wafer and the spin coating at 2000 rpm is performed for one minute. The wafer is subjected to baking at 90° C. for twenty minutes, to get a resist film of 0.5 μm thickness. The electron beam drawing is performed on the resist film at 20 kV of acceleration voltage and at 1–300 μC/cm$^2$. Then, the baking is performed at 100° C. for ten minutes. Then, the development is performed in an ordinary alkaline organic solution for one minute. FIG. 2 shows the sensitivity curve on the relation of the remaining resist thickness against dosage of a pattern obtained as explained above. The sensitivity curve shows that the sensitivity of the resist film is about 5 μC/cm$^2$.

As an example, the electron beam drawing is performed on the resist film at 20 kV of acceleration voltage and at 10 μC/cm$^2$ and then the baking is performed at 100° C. for ten minutes. Then, the development is performed in an ordinary alkaline organic solution for one minute. Thus, a precise and fine positive type resist pattern can be obtained. It is found that the highest resolution obtained in this case is 0.2 μm line and space, or a fine resist pattern at a high resolution can be obtained.

As explained above, in this embodiment, a positive type fine resist pattern can be formed stably at a high sensitivity at a high resolution by using an acid generator and a ladder type polysilane resin as a main polymer.

Embodiment 2

Figure 3:
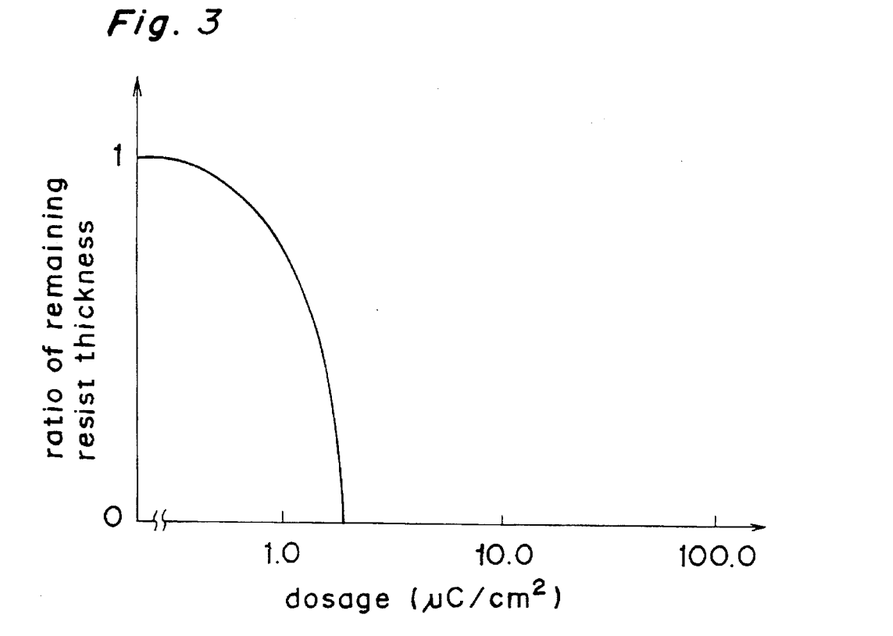
FIG. 3 is a graph of the sensitivity curve of the remaining resist thickness against the dosage in Embodiment 2.

An acid generator of 1.0 g of triphenylsulfonium salt and a poly(p-hydroxyphenylsilsesquioxane) substituted by a to t-butoxycarbonyl group are dissolved in a cellosolve acetate solution to form a mixture. The mixture is stirred slowly at 25° C. for sixty minutes, and the insoluble substances are filtered to get a homogeneous solution. The solution is dropped on a semiconductor silicon wafer and the spin coating is performed at 2000 rpm for one minute. The wafer is subjected to baking at 90° C. for twenty minutes, to get a resist film of 0.5 μm thickness. The electron beam drawing is performed on the resist film at 30 kV of acceleration voltage and at 1–300 μC/cm$^2$. Then, the baking is performed at 100° C. for ten minutes. Then, the development is performed in an ordinary alkaline organic solution for one minute. FIG. 3 shows the sensitivity curve on the relation of the remaining resist thickness of resist against dosage of a pattern obtained as explained above. The sensitivity curve shows that the sensitivity of the resist film is about 4 μC/cm$^2$.

As an example, the electron beam drawing is performed on the resist film at 30 kV of acceleration voltage and at 10 μC/cm$^2$ and then the baking is performed at 100° C. for ten minutes. Then, the development is performed in an ordinary alkaline organic solution for one minute. Thus, a precise and fine positive type resist pattern can be obtained. It is found that the highest resolution obtained in this case is 0.2 μm line and space, or a fine resist pattern at a high resolution can be obtained.

As explained above, in this embodiment, a positive type fine resist pattern can be formed stably at a high sensitivity at a high resolution by using an acid generator and a ladder type polysilane resin as a main polymer.

Embodiment 3

Next, an embodiment of a fine pattern forming method is explained.

FIGS. 4(a)–(d) show schematic sectional views of a method of forming a fine pattern. A novolac resin film of 2 μm thickness is applied as a bottom layer 12 to a semiconductor silicon wafer 11, and the heat treatment is performed at 220° C. for twenty minutes (FIG. 4(a)).

Figure 4:
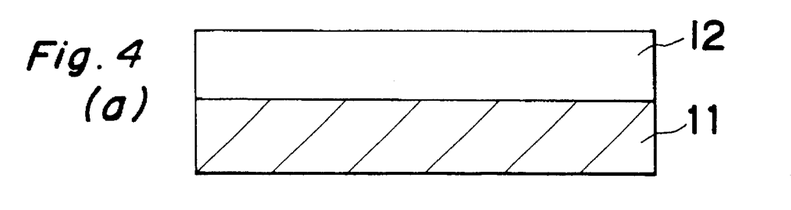
FIGS. 4(a)–(d) are schematic sectional views of a method of forming a fine pattern in Embodiment 3.

Further, the material prepared in Embodiment 1 of 0.3 μm thickness as a top layer electron beam film 13 is applied to the bottom layer 12, and the baking at 90° C. for twenty minutes is performed (FIG. 4(b)).

Next, a pattern is drawn with an electron beam 14 on the resist film 13 at acceleration voltage 20 kV at dosage 10 μC/cm$^2$, and the baking is performed at 100° C. for ten minutes. A precise, fine positive type resist pattern 13P is obtained by developing the wafer with an organic alkaline aqueous solution for one minute (FIG. 4(c)).

Then, the dry etching of the bottom layer film 12 is performed with the resist pattern 13P as a mask, a fine resist pattern of 0.2 μm line and space can be obtained precisely and vertically (FIG. 4(d)). As the selection ratio of the resist film to the bottom layer film is 50 or more, the size shift on the etching on pattern transfer is 0.05 μm or less. That is, it is found that the resist pattern of the top layer can be transferred precisely.

As explained above, in this embodiment, a positive type fine resist pattern can be formed stably at a high sensitivity at a high resolution by using a silane-containing or resist comprising an acid generator and a ladder type polysilane or polysilicone resin as a main polymer, as a top layer of a two-layer resist.

Novolac resin or the like may be included as a resolution inhibiter in the silane-containing or silicone-containing resist besides the two components.

Embodiment 4

Next, another embodiment of a fine pattern forming method is explained with reference to the drawings.

FIGS. 5(a)–(d) show schematic sectional views of a method of forming a fine pattern. A high polymer organic film of 2 μm thickness is applied as a bottom layer 31 to a semiconductor silicon wafer 11, and the heat treatment is performed at 220° C. for twenty minutes (FIG. 5(a)).

Figure 5A:
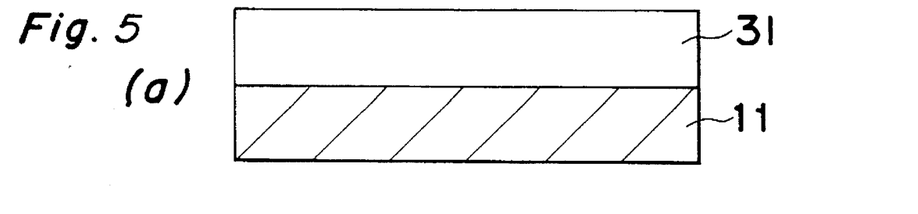
FIGS. 5(a)–(d) are schematic sectional views of a method of forming a fine pattern in Embodiment 4.
Figure 5B:
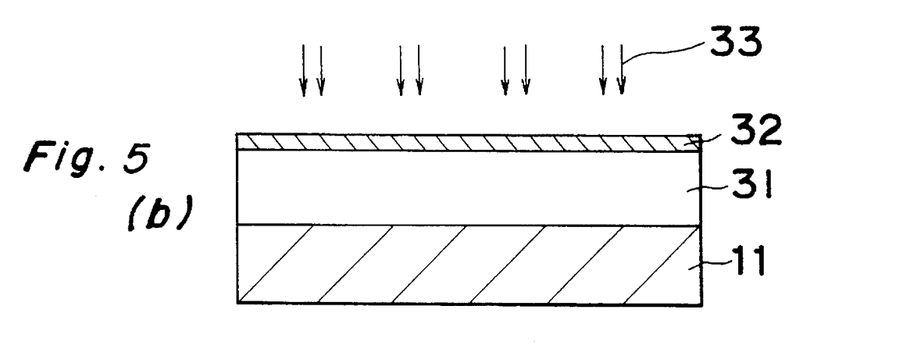
Figure 5C:
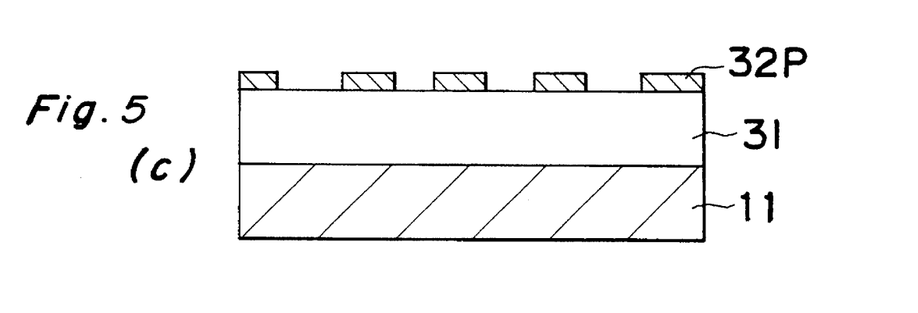

Further, the material prepared in Embodiment 2 of 0.3 μm thickness as a top layer electron beam film 32 is applied to the bottom layer 31, and the baking at 90° C. for twenty minutes is performed (FIG. 5(b)).

Next, a pattern is drawn with an electron beam 33 on the resist film 32 at acceleration voltage 30 kV at dosage 10 μC/cm$^2$, and the baking is performed at 100° C. for ten minutes. A precise, fine positive type resist pattern 32P is obtained by developing the wafer with an organic alkaline aqueous solution for one minute (FIG. 5(c)).

Figure 5D:
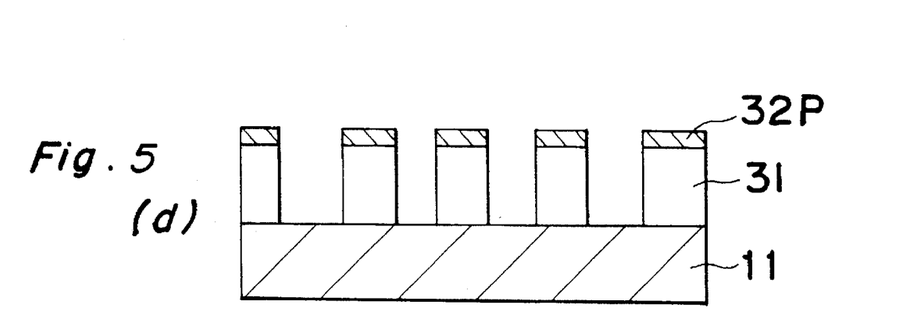

Next, the dry etching of the bottom layer film 31 is performed with the resist pattern 32P as a mask, a fine resist pattern of 0.2 μm line and space can be obtained precisely and vertically (FIG. 5(d)). As the selection ratio of the resist film to the bottom layer film is 50 or more, the size shift on the etching on pattern transfer is 0.05 μm or less. That is, it is found that the resist pattern of the top layer can be transferred precisely.

As explained above, in this embodiment, a positive type fine resist pattern can be formed stably at a high sensitivity at a high resolution by using a polysilane-containing or silicone-containing resist comprising an acid generator and a ladder type polysilane polysilicone resin as a main polymer, as the top layer of a two-layer resist.

Novolac resin or the like may be included as a resolution inhibiter in the silane-containing or silicone-containing resist besides the two components.

Embodiment 5

Next, an embodiment of a fine pattern forming method is explained.

FIGS. 6(a)–(d) show schematic sectional views of a method of forming a fine pattern. A polysilicone film 115 of 0.3 μm thickness is deposited on a semiconductor silicon wafer 11. Then, a high polymer organic film of 2 μm thickness is applied as a bottom layer 112 to a semiconductor silicon wafer 111, and the heat treatment is performed at 220° C. for twenty minutes (FIG. 6(a)).

Figure 6A:
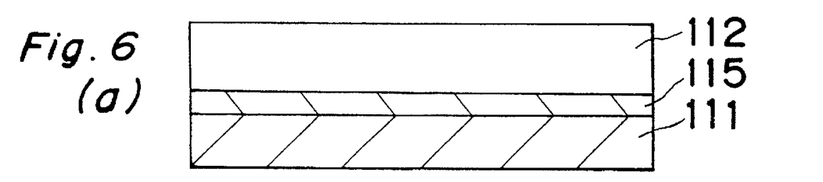
FIGS. 6(a)–(d) are schematic sectional views of a method of forming a fine pattern in Embodiment 5.
Figure 6B:
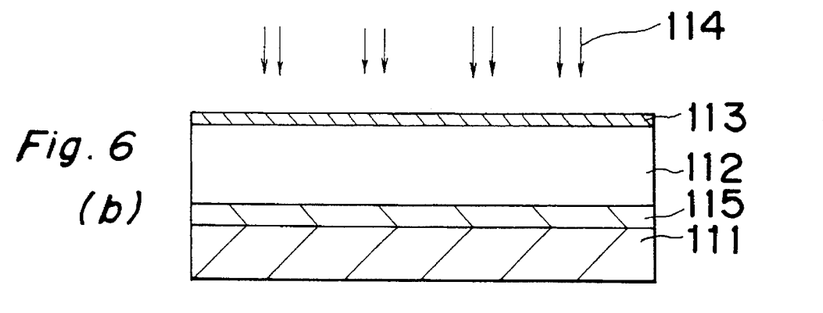
Figure 6C:
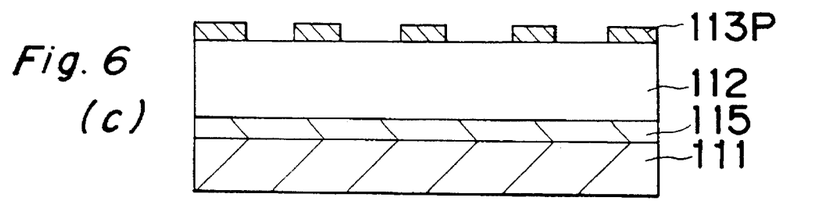

Further, the material prepared in Embodiment 1 of 0.3 μm thickness as a top layer electron beam film 113 is applied to the bottom layer 112, and the baking at 90° C. for twenty minutes is performed (FIG. 6(b)).

Next, a pattern is drawn with an electron beam 114 on the resist film 113 at acceleration voltage 20 kV at dosage 10 μC/cm$^2$, and the baking is performed at 100° C. for ten minutes. A precise, fine positive type resist pattern 113P is obtained by developing the wafer with an organic alkaline aqueous solution for one minute (FIG. 6(c)).

Figure 6D:
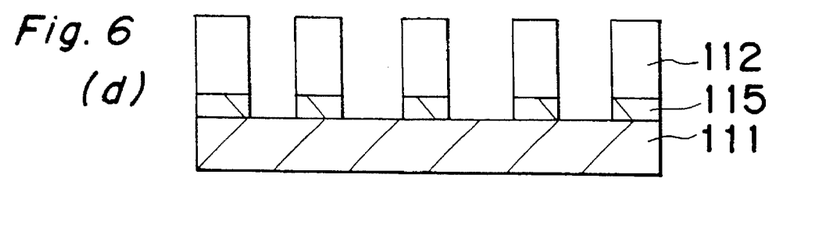

Next, the dry etching of the bottom layer film 112 is performed with the resist pattern 113P as a mask, a fine resist pattern of 0.2 μm line and space can be obtained precisely and vertically (FIG. 6(d)). As the selection ratio of the resist film to the bottom layer film is 50 or more, the size shift on the etching on pattern transfer is 0.05 μm or less. That is, it is found that the resist pattern of the top layer can be transferred precisely.

Further, the polysilicone film 115 is etched by using the resist pattern as a mask, the top layer resist pattern 113P can be etched at the same time, and a precise pattern transfer can be performed (FIG. 6(d)). The top layer resist can be removed easily with gas plasma of fluorine.

As explained above, in this embodiment, a positive type fine resist pattern can be formed stably at a high sensitivity at a high resolution by using a silane-containing or silicone-containing resist comprising an acid generator and a ladder type polysilane polysilicon resin as a main polymer, as the top layer of a two-layer resist.

Further, the resist can be removed easily with etching with plasma, and it can be handled easily.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A fine pattern forming method, comprising the steps of:

forming a high polymer organic film on a semiconductor substrate;

forming a photosensitive layer on said high polymer organic film, said photosensitive layer comprising a polysilane resin insoluble in an alkaline solution and an acid generator which generates an acid when irradiated with an electron beam, said polysilane resin including a Si—Si bond in a principal chain and a group expressed as —OR in a side chain wherein R denotes a group which can be decomposed by an acid;

forming a pattern with an electron beam on the photosensitive layer, thereby causing the generation of an acid by the acid generator, and baking the photosensitive layer to accelerate the decomposition reaction of the side chain by the generated acid to make the polysilane resin in the pattern region soluble in an alkaline solution;

developing the photosensitive layer with an alkaline aqueous solution to form a positive resist pattern; and etching the high polymer organic film by using the positive resist pattern as a mask.

2. A fine pattern forming method according to claim 1, wherein said polysilane resin is a ladder polysilane.

3. A fine pattern forming method, comprising the steps of:

forming a high polymer organic film on a semiconductor substrate;

forming a photosensitive layer on said high polymer organic film, said photosensitive layer comprising a ladder polysilicone resin insoluble in an alkaline solution and an acid generator which generates an acid when irradiated with an electron beam, said polysilicone resin including a Si—O bond in a principal chain and a group expressed as —OR in a side chain wherein R denotes a group which can be decomposed by an acid;

forming a pattern with an electron beam on the photosensitive layer, thereby causing the generation of an acid by the acid generator, and baking the photosensitive layer to accelerate the decomposition reaction of the side chain by the generated acid to make the polysilicone resin in the pattern region soluble in an alkaline solution;

developing the photosensitive layer with an alkaline aqueous solution to form a positive resist pattern; and etching the high polymer organic film by using the positive resist pattern as a mask.

* * * * *